United States Patent [19]

Migliavacca

[11] Patent Number: 6,124,759

[45] Date of Patent: *Sep. 26, 2000

[54] COMPARATOR WITH A LARGE INPUT VOLTAGE EXCURSION

[75] Inventor: Paolo Migliavacca, Grenoble, France

[73] Assignee: SGS-Thomson Microelectronics S.A., Gentilly, France

[ * ] Notice: This patent issued on a continued prosecution application filed under 37 CFR 1.53(d), and is subject to the twenty year patent term provisions of 35 U.S.C. 154(a)(2).

[21] Appl. No.: 09/057,970

[22] Filed: Apr. 9, 1998

[30] Foreign Application Priority Data

Apr. 15, 1997 [FR] France ................................ 97 04912

[51] Int. Cl.⁷ ........................................................ H03F 3/45
[52] U.S. Cl. ................................................ 330/253; 330/261
[58] Field of Search .................................... 330/253, 257, 330/261, 252

[56] References Cited

U.S. PATENT DOCUMENTS

| | | | |
|---|---|---|---|
| 4,728,900 | 3/1988 | Nakagawara et al. | 330/253 |
| 5,142,244 | 8/1992 | Glica et al. | 330/253 |
| 5,210,506 | 5/1993 | Koch et al. | 330/255 |
| 5,337,008 | 8/1994 | Badval | 330/253 |
| 5,337,009 | 8/1994 | Koch et al. | 330/253 |
| 5,371,474 | 12/1994 | Wassenaar et al. | 330/253 |
| 5,670,910 | 9/1997 | Kato | 330/253 |
| 5,751,186 | 5/1998 | Nakao | 327/562 |

OTHER PUBLICATIONS

French Search Report from French Patent Application 97 04912, filed Apr. 15, 1997.

*Primary Examiner*—Robert Pascal
*Assistant Examiner*—Henry Choe
*Attorney, Agent, or Firm*—Wolf, Greenfield & Sacks, P.C.; James H. Morris; Theodore E. Galanthay

[57] ABSTRACT

The present invention relates to a BICMOS technology comparator including: a first stage with differential inputs capable of operating with input voltages which are, in the common mode, lower than a positive supply potential minus a first threshold voltage, the first stage controlling a first bipolar output transistor; a second stage with differential inputs for operating with input voltages which are, in the common mode, higher than a negative supply potential plus a second threshold voltage, the second stage controlling a second bipolar output transistor and the output transistors being connected in series between two terminals at the positive and negative supply potentials, and a midpoint of their series connection forming an output terminal of the comparator; and circuitry for controlling the differential stages according to the voltages applied on their inputs.

7 Claims, 3 Drawing Sheets

COMPARATOR WITH A LARGE INPUT VOLTAGE EXCURSION

BACKGROUND OF THE INVENTION

1. Field of the Invention

The present invention relates to a comparator having a large input voltage excursion, that is, the input voltage of the comparator is close to the high and low supply voltages. This type of comparator is generally called a rail-to-rail comparator.

2. Discussion of the Related Art

FIG. 1 shows a first conventional example of such a comparator.

The comparator is formed of a differential stage 1, having two positive and negative input voltages 2 and 3 which receive voltages V+, V− to be compared. An output terminal 4 of stage 1 controls a transistor Ts mounted in series with a current source 5 between two terminals A and M, on which are applied, respectively, high and low supply potentials Vdd and Vss.

In the example shown in FIG. 1, stage 1 is formed of two P-channel MOS transistors MP1, MP2, the respective gates of which are connected to terminals 2 and 3 and the respective sources of which are connected, via a current source 6, to terminal A. The drains of transistors MP1 and MP2 are respectively connected to the collector of an NPN-type bipolar transistor T1, T2, the emitter of which is connected to terminal M. Transistors T1 and T2 are connected as a current mirror and transistor T1 is diode-connected. Terminal 4 is formed by the drain of transistor MP2, connected to the base of NPN-type transistor Ts. The emitter of transistor Ts is connected to terminal M and its collector is connected to an output terminal S of the comparator connected, via current source 5, to terminal A.

When voltage V+ is lower than voltage V−, the voltage difference ΔV between terminals 2 and 3 is negative and current I1 in transistor MP1 is higher than current I2 in transistor MP2. As transistor T2 attempts to reproduce current I1, it saturates, which blocks transistor Ts. Output voltage Vs of the comparator then corresponds to voltage Vdd−Vss, minus the voltage drop in current source 5. This voltage drop corresponds, for example if the current sources are realized by means of bipolar transistors, to the collector-emitter drop of a saturating bipolar transistor. If the current sources are formed of MOS transistors, this voltage drop corresponds to a drain-source voltage drop. Current sources 5 and 6 are generally formed of transistors connected as a current mirror.

When V+=V−(ΔV=0), current I1 and I2 are balanced and transistor Ts is non-conducting. Terminal S is then substantially at potential Vdd.

When voltage V+ is higher than voltage V−(ΔV>0), current I2 is higher than current I1. The current mirror between transistors T1 and T2 maintains the collector currents of transistors T1 and T2 identical. As a result, transistor Ts saturates. Terminal S is then at potential Vss plus the collector-emitter voltage drop of saturating transistor Ts. Thus, the output voltage excursion substantially corresponds to the supply voltage.

However, for such an assembly to function, input voltages V+ and V− must respect a common mode constraint, that is, a voltage level constraint (independently from differential voltage ΔV).

If the potential of one of terminals 2 and 3 is higher than potential Vdd, minus a threshold voltage Vth corresponding to a threshold voltage Vgsp of a P-channel MOS transistor (MP1 or MP2) plus voltage drop V6 in current source 6, the comparator no longer operates properly. If V−>Vdd−Vth, transistor MP2 is non-conducting and transistor Ts can receive no base current. Terminal S is thus substantially at potential Vdd, whatever voltage V+. If V+>Vdd−Vth, transistor MP1 is non-conducting and current I1 is zero. Transistors T1 and T2 are thus both non-conducting (they receive no base current). The only case where the result of the comparison is then nevertheless correct is when V−≦Vdd−Vth since, as source 6 is not blocked, transistor Ts saturates and Vs≈Vss.

In practice, the comparator of FIG. 1 thus requires input voltages which are, in the common mode, lower by approximately 1 to 1.5 volts than the positive supply voltage.

FIG. 2 shows a second example of comparator in which the operation of input differential stage 1' is limited to input voltages which are, in the common mode, higher than low supply potential Vss, plus a threshold voltage Vth'. Threshold voltage Vth' corresponds to a threshold voltage Vgsn of an N-channel MOS transistor, plus voltage drop V6' in current source 6' of stage 1'.

The assembly of FIG. 2 is similar to that of FIG. 1, but is inverted with respect to terminals A and M and uses N-channel transistors MN1 and MN2 instead of the P-channel MOS transistors of FIG. 1, and PNP-type bipolar transistors T'1, T'2, and T's instead of transistors T1, T2, Ts of the assembly of FIG. 1.

In the voltage operating range of the comparator of FIG. 2, if ΔV≧0, transistor T's is blocked and Vs≈Vss. If ΔV<0, transistor T's saturates and Vs≈Vdd. However, if V−<Vss+Vth', transistor MN2 is blocked and cannot take current from the base of transistor T's which is thus blocked. Voltage Vs is then in the low state, independently from differential voltage ΔV. If V+<Vss+Vth', transistor MN1 is blocked. Transistors T'1 and T'2 are then blocked. The only case where the result of the comparison is nevertheless correct is when V−≧Vss+Vth', since, as source 6' is not blocked, transistor T's saturates and Vs≈Vdd.

In practice, the comparator of FIG. 2 thus requires input voltages which are, in the common mode, higher by approximately 1 to 1.5 volts than the negative supply voltage.

It should be noted that the problems described hereabove, in relation to assemblies using both transistors in bipolar technology and in MOS technology, arise in the same manner for comparators realized in integrated bipolar technology or integrated MOS technology.

It would be desirable to have a comparator operating at least over the entire range of common mode voltages of the circuit, that is, withstanding input voltages at least in the entire supply voltage range (Vdd−Vss) while keeping a large output voltage excursion.

Document EP-A-0512795 describes a comparator consisting of MOS transistors combining two stages respectively designed for operating with a common mode input voltage substantially equal to one of the supply voltages. This combination allows, for the comparator as a whole, input voltages reaching the supply voltages in common mode. However, this circuit is limited to a use of MOS transistors with the output transistors.

SUMMARY OF THE INVENTION

The present invention provides a novel structure of a comparator which operates with differential inputs withstanding common mode voltages which may exceed the range of the supply voltage of the comparator while keeping a large output voltage excursion.

The invention more particularly provides a solution integrable in BICMOS technology.

The present invention also provides such a comparator which has low power consumption and, in particular, the power consumption of which is independent from the common mode voltages present on its inputs.

To achieve these and other objects, the present invention provides a BICMOS technology comparator including: a first stage with differential inputs capable of operating with input voltages which are, in the common mode, lower than a positive supply potential minus a first threshold voltage, the first stage controlling a first bipolar output transistor; a second stage with differential inputs for operating with input voltages which are, in the common mode, higher than a negative supply potential plus a second threshold voltage, the second stage controlling a second bipolar output transistor and the output transistors being connected in series between two terminals at the positive and negative supply potentials, a midpoint of their series connection forming an output terminal of the comparator; and means for controlling the differential stages according to the voltages applied on their inputs.

According to an embodiment of the present invention, said means are formed of two switches connected in series between the supply terminals, the midpoint of the series connection of the switches being connected to the output terminal and each switch including a control terminal connected to the midpoint of a series connection of a first current source with the differential stage with which the switch is associated.

According to an embodiment of the present invention, a second current source is interposed between each switch and the supply terminal associated therewith.

According to an embodiment of the present invention, each second current source is connected as a current mirror on the first current source of the differential stage with which the corresponding switch is associated.

According to an embodiment of the present invention, a control stage is interposed between each switch and the differential stage associated therewith.

According to an embodiment of the present invention, each control stage of a switch includes a third current source connected as a current mirror on the second current source associated with the other switch.

According to an embodiment of the present invention, each control stage is formed of a MOS transistor connected in series with the third current source between the supply terminals, the gate of the MOS transistor of each control stage being connected to the midpoint of the series connection of the first current source and of the differential stage with which the switch is associated.

According to an embodiment of the present invention, each switch is formed of a MOS transistor.

The foregoing and other objects, features and advantages of the present invention, will be discussed in detail in the following non-limiting description of specific embodiments in connection with the accompanying drawings.

DETAILED DESCRIPTION

Figure 1:
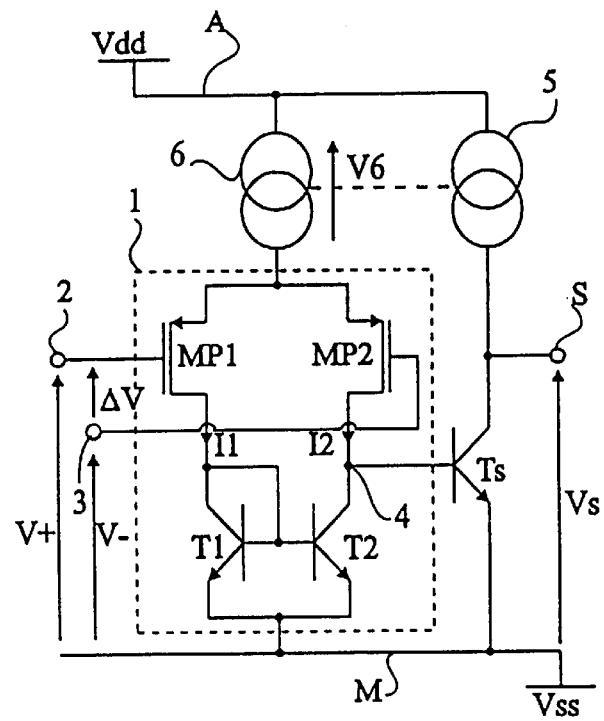
FIGS. 1 and 2 previously described are meant to show the state of the art and the problem to solve.

The same elements have been referred to with the same reference numbers in the different drawings. For clarity, only those elements necessary to the understanding of the present invention have been shown in the drawings.

A characteristic of the present invention is to associate two differential stages that receive, on their respective inputs, different common mode voltages, and to provide an automatic selection of the differential stage which is operational, according to the common mode voltages of the differential inputs.

Figure 3:
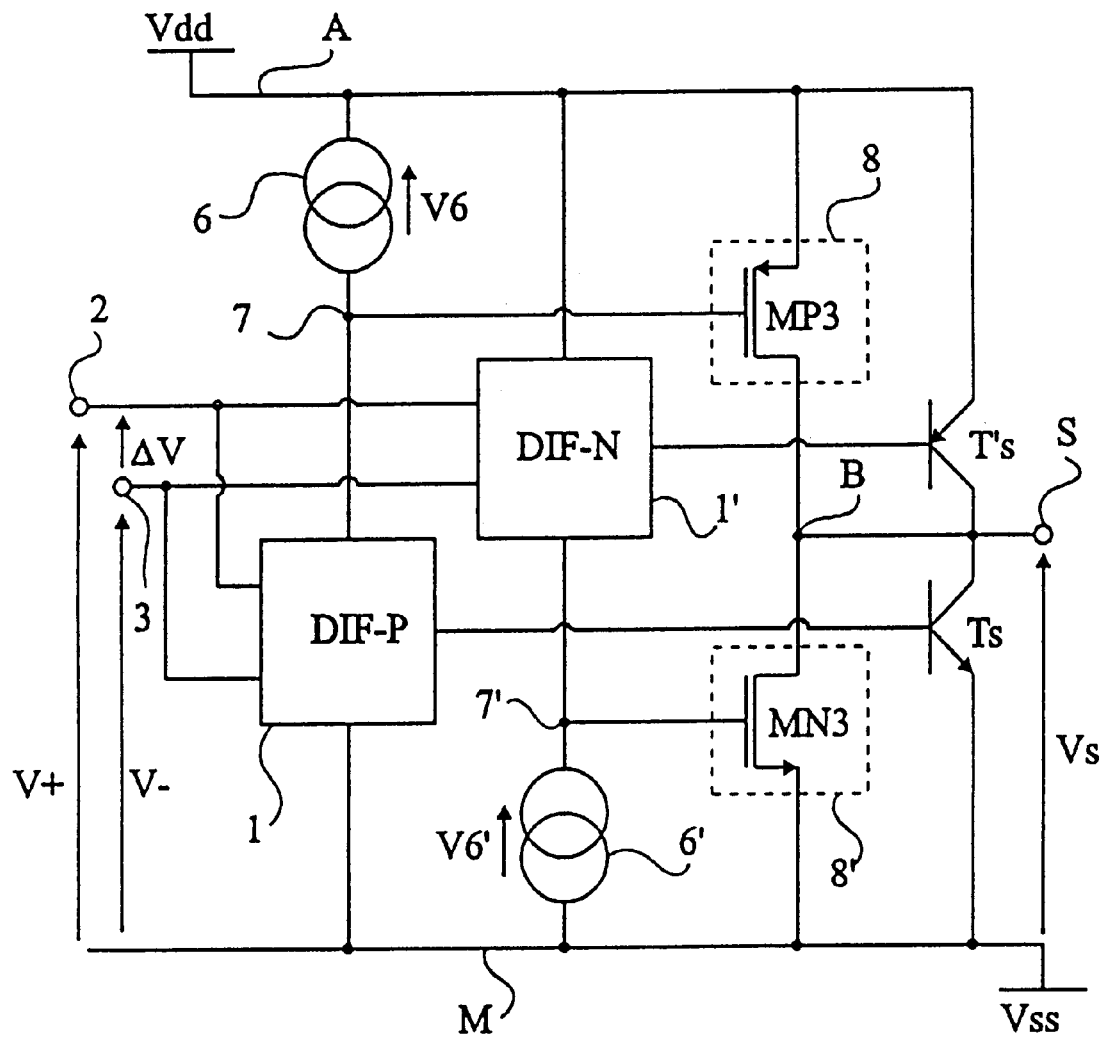
FIG. 3 shows, partially in block form, a first embodiment of a comparator according to the present invention.

FIG. 3 shows a first embodiment of a comparator according to the present invention.

Figure 2:
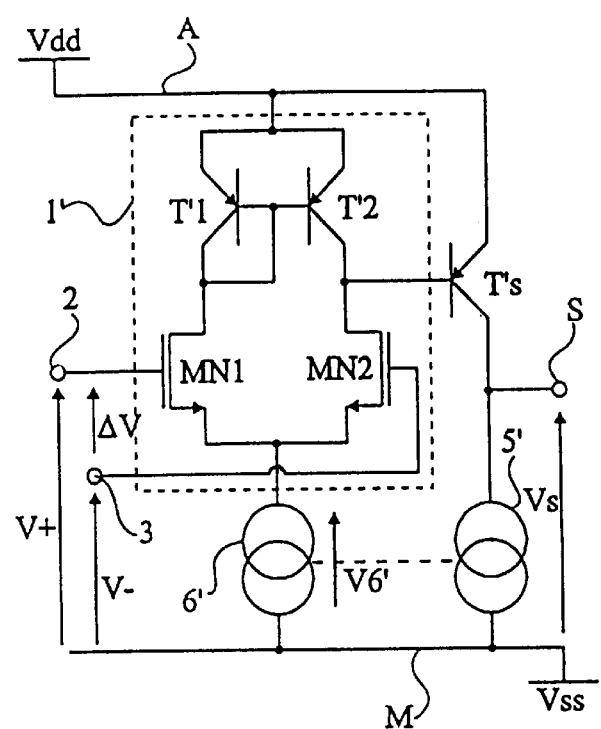

According to the present invention, the comparator includes two differential input stages 1, 1' which are each associated with a current source 6, 6'. A first stage (DIF_P) 1, similar to the differential stage shown in FIG. 1, is directly connected to a terminal M for receiving a low supply potential Vss and, via source 6, to a terminal A for receiving a high supply potential Vdd. A second differential stage (DIF_N) 1', similar to the differential stage shown in FIG. 2, is directly connected to terminal A and, via source 6', to terminal M.

A positive input of each differential stage 1, 1' is connected to a terminal 2 for receiving a first voltage V+, to be compared with a second voltage V− applied on a terminal 3 connected to a negative input of each stage 1, 1'. The respective outputs of stages 1 and 1' are connected to the respective bases of two output transistors Ts and T's connected in series between terminals M and A. The emitter of PNP-type transistor T's is connected to terminal A. The emitter of NPN-type transistor Ts is connected to terminal M and the collectors of transistors T's and Ts form an output terminal S of the comparator.

According to the present invention, the midpoints 7, 7' of the series connections of current sources 6, 6' and of differential stages 1, 1' are respectively connected to a control terminal of a switch 8, 8'. Switches 8, 8' are connected in series between terminals A and M and the midpoint B of their series connection is connected to terminal S.

A first function of switches 8 and 8' is to select a single one of differential stages 1 or 1', when one of voltages V+, V− is such that one of differential stages 1, 1' cannot operate properly.

A second function of switches 8 and 8' is to replace the current sources (5, FIG. 1 and 5', FIG. 2) to enable the operation of transistors Ts and T's.

Switches 8 and 8' are, for example, formed of MOS transistors, respectively a P-channel transistor MP3 and an N-channel transistor MN3, the respective drains of which are connected to source S. The sources of transistors MP3 and MN3 are respectively connected to terminals A and M and their gates are respectively connected to terminals 7 and 7'.

It should be noted that the current sources formed by transistors MP3 and MN3 are not, according to the present invention, connected as current mirrors on respective sources 6 and 6'. Thus, transistors MP3 and MN3 can also perform their function of turning off stage 1 or 1'.

Transistor MP3 is non-conducting when the potential of node 7 is higher than potential Vdd, minus threshold voltage Vgsp of transistor MP3, and thus when one of voltages V+ or V− is, in the common mode, higher than potential Vdd plus two threshold voltages Vgsp (transistors MP1 and MP3). Transistor MN3 is non-conducting when the potential of node 7' is lower than potential Vss, plus threshold voltage Vgsn of transistor MN3, and thus when one of voltages V+ or V− is lower, in the common mode, than potential Vss plus two threshold voltages Vgsn (transistors MN1 and MN3).

It should be noted that, according to the present invention, the range of each stage 1, 1', in common mode voltages V+ or V−, is reduced with respect to conventional assemblies. This is however not disturbing since the other stage is then likely to operate.

The operation of a comparator such as shown in FIG. 3 is the following for the different cases of voltages V+ and V− likely to occur.

1/V−>Vdd−2Vgsp. Transistor Ts is off and transistor MN3 is on. The result of the comparison is conditioned by stage 1'.

If V+≦Vdd−2Vgsp, transistor MP3 is on. Transistor T's saturates, even if V+ is lower than Vss+2Vgsn (since V− is high enough for source 6' not to be blocked). Thus, Vs≈Vdd.

If V+>Vdd−2Vgsp, transistor MP3 is off. If ΔV<0, transistor T's saturates and Vs≈Vdd. If ΔV>0, transistor T's is non-conducting and Vs≈Vss (through transistor MN3).

2/V−<Vss+2Vgsn. Transistor T's is off and transistor MP3 is on. The result of the comparison is conditioned by stage 1.

If V+≧Vss+2Vgsn, transistor MN3 is on. Transistor Ts saturates, even if V+ is higher than Vdd−2Vgsp (since V− is low enough for source 6 not to be blocked). Thus, Vs≈Vss.

If V+<Vss+2Vgsn, transistor MN3 is off. If ΔV>0, transistor Ts saturates and Vs≈Vss. If ΔV<0, transistor Ts is off and Vs≈Vdd (through transistor MP3).

3/Vss+2Vgsn≦V+≦Vdd−2Vgsp and Vss+2Vgsn≦V−≦Vdd−2Vgsp, both stages 1 and 1' operate.

If ΔV>0, transistor Ts saturates and transistor T's is off, Vs≈Vss. In particular, the invention allows the use of voltages V+ and V− respectively greater than Vdd and smaller than Vss in a BICMOS technology circuit, independently of the manufacturing dispersions conditioning the thresholds of the transistors. In the circuit known from document EP-A-0512795, this is not possible due to the dispersions between the thresholds of the transistors from one circuit to the other of two different batches carried out with the same process. According to the invention, using active loads $T_1$, $T_2$, $T'_1$, $T'_2$ in bipolar technology overcomes these dispersions. The selection of the active loads as bipolar transistors necessitates the use of bipolar output transistors.

If ΔV<0, transistor Ts is off and transistor T's saturates, Vs≈Vdd.

It should be noted that voltages V+ and V− can even, in common mode, exceed potentials Vdd and Vss.

An advantage of a comparator according to the present invention is that it operates whatever the common mode levels of the input voltages.

Figure 4:
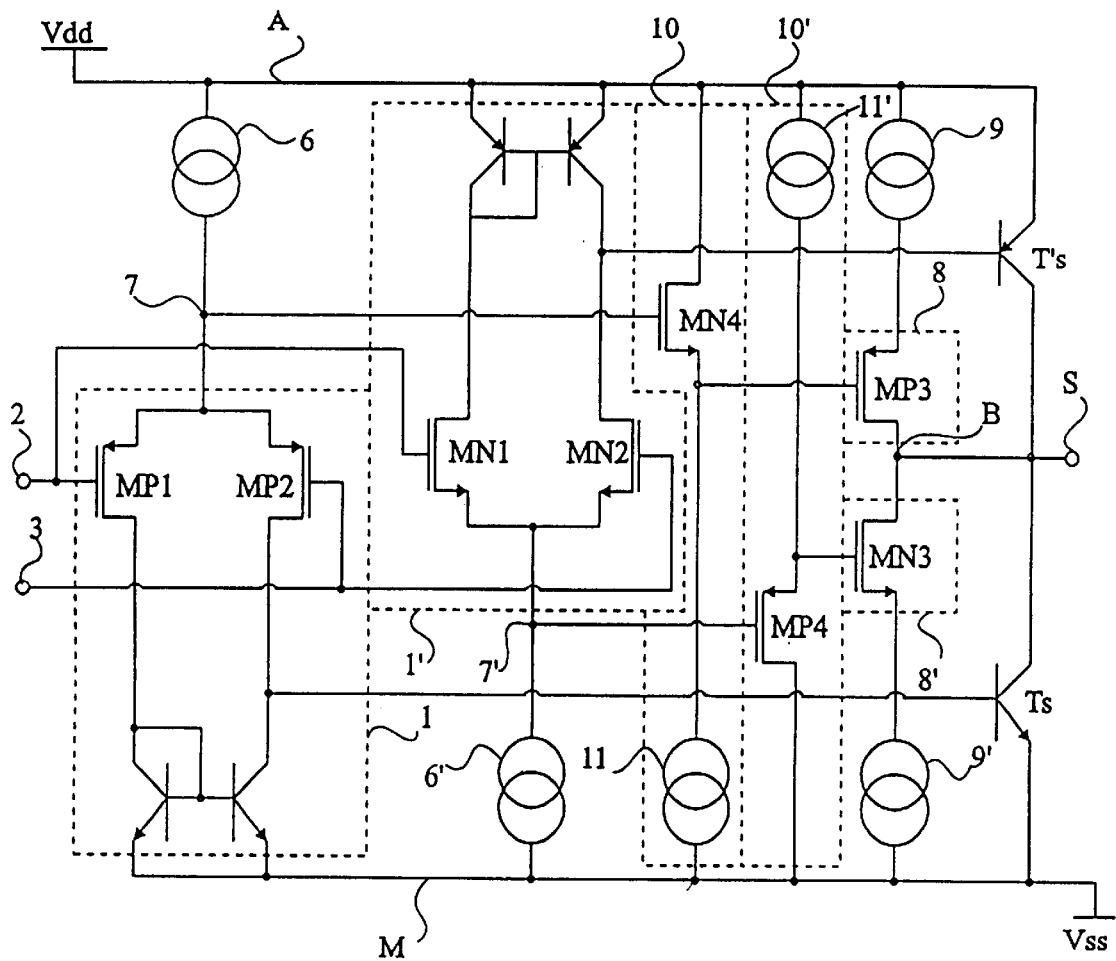
FIG. 4 shows a second embodiment of a comparator according to the present invention.

FIG. 4 shows a second embodiment of a comparator according to the present invention.

This assembly includes an improvement with respect to the first embodiment, to make the power consumption of the comparator independent from the common mode voltages. Indeed, in the assembly of the first embodiment, the power consumption depends on voltages V+ and V−.

According to this second embodiment, each transistor MP3, MN3 is associated with a current source 9, 9' connected as a current mirror on source 6, 6' of the corresponding differential stage 1, 1'. Thus, a source 9 is interposed between the source of transistor MP3 and terminal A, and a source 9' is interposed between the source of transistor MN3 and terminal M.

Current sources 9 and 9' make the current taken from or issued to terminal S independent from voltages V+ and V−.

An advantage of this second embodiment is that it makes the comparator power consumption independent from the common mode voltages present on its input terminals.

Preferably, each transistor MP3, MN3 is further associated with a control stage 10, 10'. Stage 10 is formed of an N-channel MOS transistor MN4, the drain of which is connected to terminal A and the source of which is connected, via a current source 11, to terminal M. The gate of transistor MN4 is connected to node 7 and its source is connected to the gate of transistor MP3. Current source 11 is mounted as a current mirror on current source 6' of differential stage 1'. Stage 10' is formed of a P-channel MOS transistor MP4, the drain of which is connected to terminal M and the source of which is connected, via a current source 11', to terminal A. The gate of transistor MP4 is connected to node 7' and its source is connected to the gate of transistor MN3. Current source 11' is connected as a current mirror on current source 6 of differential stage 1.

Transistor MN4 adds voltage V+ on the gate of transistor MP3 by compensating the gate-source voltage of transistor MP1. Similarly, transistor MP4 adds common mode voltage V− on the gate of transistor MN3 by compensating the gate-source voltage of transistor MN2.

Transistors MP3 and MN3 are thus on in a larger voltage range than in the first embodiment. This has the advantage of optimizing the response times over the entire range of common mode voltages according to a fixed maximum power consumption. The response times can also be adjusted by modifying the gate width/length (W/L) ratios of transistors MP4 and MN4, without affecting the maximum power consumption thanks to the current mirrors of sources 11 and 11'.

Of course, the present invention is likely to have various alterations, modifications, and improvements which will readily occur to those skilled in the art. In particular, although reference has been made in the preceding description to embodiments using bipolar and MOS technologies within the same assembly, the present invention also applies to a comparator realized in integrated bipolar technology or in integrated MOS technology. For a circuit in MOS technology, it is enough to replace the PNP-type bipolar transistors with P-channel MOS transistors and the NPN-type bipolar transistors with N-channel MOS transistors. Similarly, for a circuit in bipolar technology, the P-channel MOS transistors will be replaced with PNP-type bipolar transistors and the N-channel MOS transistors will be replaced with NPN-type bipolar transistors.

Further, the respective sizings of the different components of the assembly according to the present invention are within the abilities of those skilled in the art according to the desired application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A BICMOS technology comparator, comprising:

an integrated BICMOS circuit comprising a first integrated BICMOS portion and a second integrated BICMOS portion;

the first integrated BICMOS portion having a first stage with differential inputs capable of operating with input voltages which are, in a common mode, lower than a positive supply potential minus a first threshold voltage, the first stage controlling a first bipolar output transistor;

the second integrated BICMOS portion having a second stage with differential inputs for operating with input voltages which are, in the common mode, higher than a negative supply potential plus a second threshold voltage, the second stage controlling a second bipolar output transistor and the output transistors being connected in series between two terminals at the positive and negative supply potentials, a midpoint of their series connection forming an output terminal of the comparator; and means for controlling the differential stages according to the voltages applied on their inputs;

wherein said means are formed of two switches connected in series between the supply terminals, the midpoint of the series connection of the switches being connected to the output terminal and each switch including a control terminal connected to the midpoint of a series connection of a first current source with the differential stage with which the switch is associated.

2. The comparator of claim 1, wherein a second current source is interposed between each switch and the supply terminal associated therewith.

3. The comparator of claim 2, wherein each second current source is connected as a current mirror on the first current source of the differential stage with which the corresponding switch is associated.

4. The comparator of claim 1, wherein a control stage is interposed between each switch and the differential stage associated therewith.

5. The comparator of claim 4, wherein each control stage of a switch includes a third current source connected as a current mirror on the second current source associated with the other switch.

6. The comparator of claim 5, wherein each control stage is formed of a MOS transistor connected in series with the third current source between the supply terminals, the gate of the MOS transistor of each control stage being connected to the midpoint of the series connection of the first current source and of the differential stage with which the switch is associated.

7. The comparator of claim 1, wherein each switch is formed of a MOS transistor.

* * * * *